Figure 1:
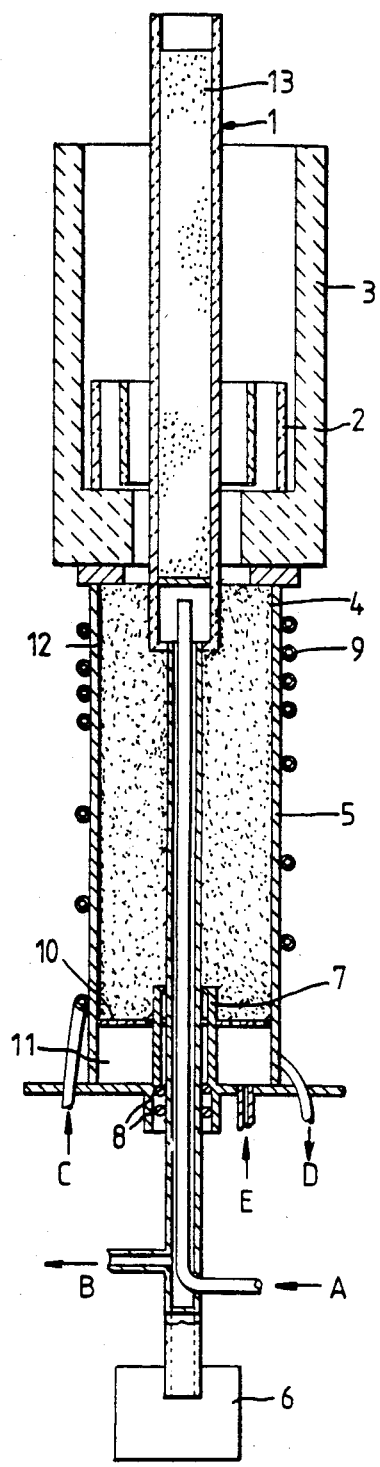

United States Patent [19]

Quested et al.

[11] Patent Number: 4,573,516
[45] Date of Patent: Mar. 4, 1986

[54] METHOD OF AND APPARATUS FOR CASTING DIRECTIONALLY SOLIDIFIED ARTICLES

[75] Inventors: Peter N. Quested, Hampton; James E. Northwood, Hampshire, both of England

[73] Assignee: The Secretary of State for Defence in Her Britannic Majesty's Government of the United Kingdom of Great Britain and Northern Ireland, London, England

[21] Appl. No.: 548,023

[22] Filed: Nov. 2, 1983

Related U.S. Application Data

[63] Continuation of Ser. No. 214,660, Dec. 9, 1980, abandoned.

[30] Foreign Application Priority Data

Dec. 14, 1979 [GB] United Kingdom ............... 7943193

[51] Int. Cl.$^4$ ..................... B22D 23/06; B22D 27/04
[52] U.S. Cl. ................................. 164/61; 164/66.1; 164/80; 164/122.1; 164/122.2; 164/125; 164/338.1
[58] Field of Search ............... 164/80, 122.1, 122.2, 164/125, 126, 127, 128, 338.1, 61, 66.1

[56] References Cited

U.S. PATENT DOCUMENTS

| | | | |
|---|---|---|---|
| 3,324,932 | 6/1967 | Ayers | 164/485 |
| 3,770,047 | 12/1973 | Kirkpatrick et al. | 164/122.1 X |
| 3,810,504 | 5/1974 | Piwonka | 164/122.1 |
| 3,844,724 | 10/1974 | Sloan | 422/250 |
| 3,847,203 | 11/1974 | Northwood | 164/122.1 X |
| 3,942,581 | 3/1976 | Sawyer | 164/122.1 |
| 4,190,094 | 2/1980 | Giamei | 164/125 X |
| 4,222,429 | 9/1980 | Kemp | 164/34 |

FOREIGN PATENT DOCUMENTS

2813760 10/1979 Fed. Rep. of Germany .

Primary Examiner—Nicholas P. Godici
Assistant Examiner—J. Reed Batten, Jr.
Attorney, Agent, or Firm—Cushman, Darby & Cushman

[57] ABSTRACT

A ceramic mould is supported on a stainless steel platform carried at the upper end of a water-cooled tube surrounded by a copper cylinder containing alumina powder of approximately 100 μm particle size which is fluidized by an inert gas. Metal in the mould is melted by a furnace which surrounds the mould and the mould is progressively withdrawn into the fluidized bed by which heat is extracted and transferred to water cooled coils surrounding the copper cylinder. In a modification, the inert gas is drawn from the fluidized bed by way of a filter and vacuum pump whereby the outlet pressure is reduced to about 1 torr. This reduces the risk of contamination of the alloy and permits re-use of expensive cooling gases.

32 Claims, 2 Drawing Figures

METHOD OF AND APPARATUS FOR CASTING DIRECTIONALLY SOLIDIFIED ARTICLES

This is a continuation of application Ser. No. 214,660, filed Dec. 9, 1980 and now abandoned.

This invention relates to the control of cooling in crystalline structures and is more particularly concerned with directional solidification of metal alloys such as superalloys and in-situ composite materials but may also find application with brittle crystals as produced from semi-conductor compounds.

Precision casting processes with their fine control of dimensional accuracy can reduce the amount of component machining subsequently required. Nickel-base alloys are in general easily cast and intrinsically possess many desirable properties which make them eminently suitable for gas turbine blading. Continuing development has resulted in alloys having high creep strength at the higher operating temperatures which have become prevalent. Many of these alloys moreover do not lend themselves to forging.

Some loss of ductility has been experienced due to the existence of grain boundaries extending perpendicularly to a main stress axis, giving rise to intergranular fracture. This can be largely overcome by directional solidification during casting to give a columnar structure of crystals aligned substantially parallel to the main stress axis.

Directional solidification can be successfully used to control the microstructures of alloys so as to optimise relevant properties. The production of aligned dendritic microstructures in superalloys, with consequent virtual elimination of transverse grain boundaries and development of a $<100>$ crystal texture, has led to enhancement of the mechanical properties at high temperatures, including increased creep ductility, improved thermal fatigue resistance, and increased creep rupture life.

Additionally, grain boundaries can be eliminated by control of crystal growth so that a casting will comprise a single grain of alloy with a controlled crystal texture, thus removing grain boundary weaknesses.

Directional solidification of superalloys is increasingly being used in conjunction with investment casting techniques to produce turbine blades for use in the hottest regions of both military and commercial aeroengines.

More recently directional solidification has been applied to eutectic alloys in order to produce aligned composite microstructures—the so-called in-situ composites. Such materials are at an advanced stage of development.

In order to produce aligned composite microstructures from eutectic alloys two conditions must be fulfilled:

1. The solid/liquid interface must be kept macroscopically planar by constraining the heat flow to be parallel to the desired solidification direction.
2. Nucleation must be suppressed in the melt ahead of the advancing interface.

The condition for the suppression of constitutional supercooling is that the ratio of the temperature gradient G at the solid liquid interface to the rate of solidification R should exceed a critical value $(G/R)_c$ which is a material parameter $$(G/R) > (G/R)_c$$

This gives the condition for plane front solidification. When the inequality is not satisfied, perturbations of increasing complexity develop on the solid-liquid interface as $G/R$ becomes smaller.

The ratio $G/R$ is also important in determining the solidification microstructure obtained on directionally solidifying superalloys and single phase crystals. There is a gradual progression as $G/R$ becomes smaller through cellular, dendritic to equiaxed structures. There is therefore a similar criterion for the maintenance of aligned dendrites.

Satisfaction of the above conditions ensures that the appropriate solidification morphology is obtained. However, the dimensions of the principal microstructural features, dendrites in superalloys and fibres in in-situ composites, are governed by the cooling rate GR being greatest at the highest rates of solidification. Such fine microstructures can lead to substantial improvements in the mechanical properties of directionally solidified materials.

There are several methods employed for directionally solidifying high temperature alloys, the principal ones making use of water cooled chills or cooling baths to assist in establishing a temperature gradient in the alloy being solidified. The main differences lie in the efficiency of heat extraction which determines the magnitude of the temperature gradient obtained. The aim of the solidification procedures has been to maximise G in order to allow solidification to be carried out at increased rates of solidification. This can lead to the combined benefits of improved commercial viability and better mechanical properties.

In the first case, an open-ended mould is supported on a copper chill plate from which heat is conducted by water flow and is usually combined with axial movement of the mould relative to a heat source, either the furnace used for melting the metal to be cast being movable with respect to the mould or vice versa.

Advanced techniques are based on modifications of the Bridgman-Stockbarger method of crystal growing. High temperature gradients have been obtained by removing the component being directionally solidified from the heating source into an efficient heat transfer fluid. However, there are potential hazards associated with the heat transfer fluids previously used. Liquid metal quenchants having relatively low melting points, such as tin, Woods-type alloys (Pb-Sn-Bi-In alloys) and gallium/indium alloys, may contaminate the alloy and lead to inferior mechanical properties. Heat transfer oils are also potential contaminants while there is a risk of explosion associated with water baths.

Because of the risk of contamination, cooling bath techniques are unlikely to be adopted in the commercial manufacture of gas turbine blading, and lower temperature gradients obtainable with water cooled chills have had to be accepted.

However, fluidized beds are known to have advantageous heat transfer characteristics and the present invention is directed to the use of such beds to generate high temperature gradients during directional solidification. It is desirable that the fluidized beds be chemically inert and suitable combinations of materials to this end would be stable ceramics, such as aluminum, zirconium or magnesium oxides in fine powder form fluidized by an inert gas such as argon, helium or nitrogen. Metal powders may also be employed—these possess greater thermal conductivity than ceramics.

Figure 2:
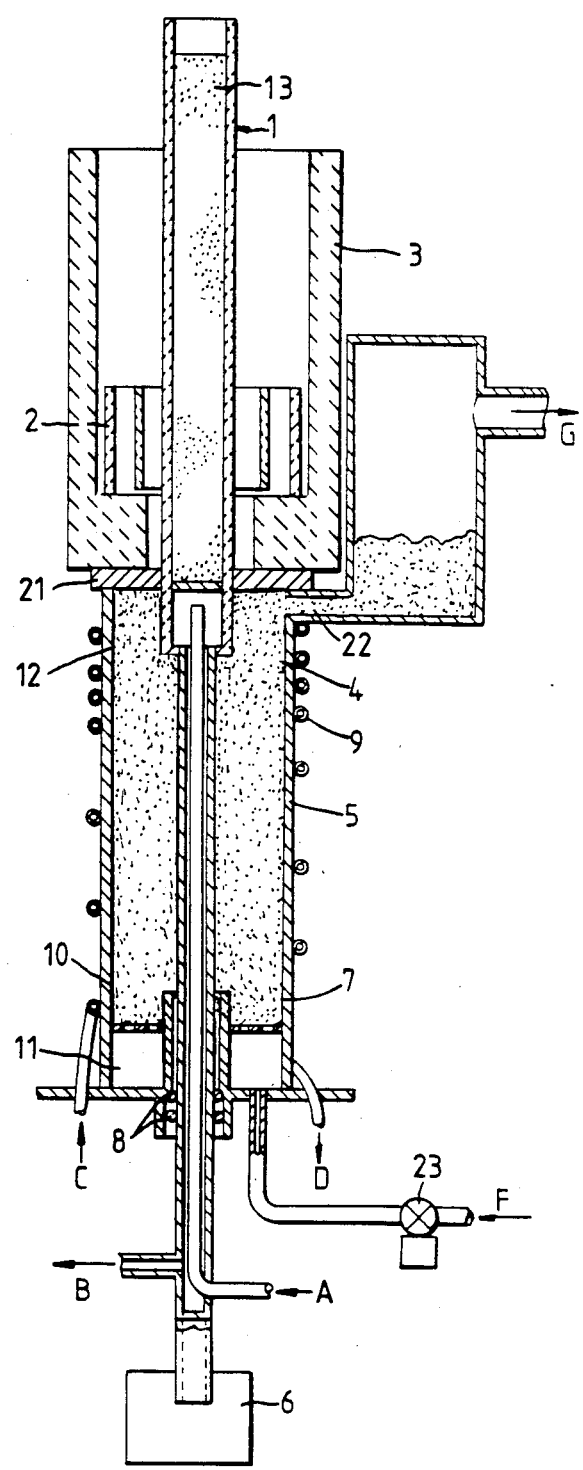

Apparatus suitable for use in connection with the invention will now be described with reference to the accompanying diagrammatic drawings of which FIGS. 1 and 2 are similar sectional views of differing arrangements of furnaces and associated equipment for directional solidification.

Referring to FIG. 1, an open-ended mould 1 comprising an alumina tube is mounted co-axially within a furnace having a double ring graphite susceptor 2 surrounded by a firebrick ring 3. The lower end of the mould 1 is carried on a hollow stainless steel platform 4 arranged to be moved axially within an open-topped copper cylinder 5 disposed beneath the furnace, by means of a suitable motor drive mechanism 6. A water supply indicated by arrow A is connected to the interior of the platform 4 which is in turn connected to a drain as indicated by arrow B, the appropriate connecting pipes passing through a seal 7 including O-rings 8 and located in the closed lower end of the cylinder 5. A coiled tube 9 is in close contact with the outer circumference of the cylinder 5 and is connected at its ends to a water supply and drain as indicated by the arrows C, D respectively.

A perforated diffuser plate 10 located within the cylinder 5 at a short distance from its closed end divides the cylinder into two chambers, the smaller lower one constituting a plenum chamber 11 while the upper one is filled with ceramic powder 12.

The alloy to be directionally solidified 13 is introduced into the mould 1 either in molten or powder form, or it may already be in place as an ingot before insertion of the mould into the furnace. Typically the alloy could be in the form of a component, such as a blade for a gas turbine, in a shell-mould prepared by investment casting technique.

The alloy is melted by radiation from the graphite susceptor 2 which is inductively heated by a radio frequency generator (not shown). The mould is moved downwards by the motor drive mechanism 6 so that a short zone of the alloy is melted progressively. An inert gas is introduced into the bottom of the cylinder as indicated by the arrow E and flows through the ceramic powder which thereby forms a fluidized-bed. Cooling water is circulated through the stainless steel platform 4, which acts as a chill to initiate the solidification process, and through the coiled tube 9.

Continued movement of the mould 1 through the fluidized bed causes heat transfer from the progressively solidifying molten zone of the alloy through the fluidized-bed to the water-cooled coiled tube 9. The fluidized-bed gives an efficient heat transfer. A high temperature gradient is obtainable whereby nucleation of the melt ahead of the advancing interface may be adequately suppressed. The rate of heat transfer can be closely controlled by varying the rate of flow of the fluidizing gas.

In this way dendritic microstructures are obtainable which approach those resulting from cooling baths but with appreciably reduced risk of contamination or explosion.

By way of example, ingots of a superalloy MAR-MOO2 (MAR being a Registered Trade Mark) measuring 12.5 mm dia × ~300 mm have been directionally solidified at 300 mmh$^{-1}$ by quenching in a fluidized-bed comprising alumina powder of approximate 100 μm particle size using argon or helium as the heat transfer gas.

Similar dendritic structures were obtained, exhibiting both primary and secondary branches and variations in dendritic sizes due to different operating conditions of the fluidized bed were relatively small. The finest microstructures were obtained using helium as the fluidizing gas and with smooth, rather than turbulent, fluidization using argon. The greatest power was also required to melt the alloys which were quenched in the helium or smoothly fluidized argon beds. Observations indiate that the highest temperature gradient was obtained in these cases. It is well known that the smallest dendrites are obtained at high cooling rates (G R) and that the highest power requirements occur when high temperature gradients occur.

|  |  | Primary Dendrite Arm Spacing μm | Secondary Dendrite Arm Spacing μm | Power Setting | Gas Flow 1 m$^{-1}$ |
| --- | --- | --- | --- | --- | --- |
| Liquid Metal* |  | 104 | 29 | 425 | 3.1 |
| Argon fluidized bed (Smooth fluidization) | G15 | 126 | 24 | 290 | 3.1 |
| Argon fluidized bed ("Gusting") | G16 | 148 | 28 | 300 | 4.9 |
| Argon fluidized bed (Smooth + Superheat greater) | G19 | 129 | 29 | 325 | 3.1 |
| Helium fluidized bed (Smooth fluidization) | G18 | 115 | 25 | 425 | 1.5 |

*Simple ring susceptor used; in other experiments a "concentrator" was used to "focus" the power. All these examples use the radiative heat.

The measurements of primary dendrite arm spacings obtained during fluidized bed cooling are somewhat larger than those resulting from liquid metal cooling. Comparison with previous characterization of the dendrite spacings in this alloy suggests that fluidized bed cooling gives a cooling rate GR ~ 2, 700K mm$^{-1}$ indicating a temperature gradient G ~ 9 K. mm$^{-1}$ which is intermediate between the values for liquid metal (G ~ 13 K. mm$^{-1}$) and conventional Bridgman cooling (G ~ 5 K. mm$^{-1}$) for the present solidification configuration.

As further example of the invention, a development eutectic composite, designated γ-γ'-Cr$_3$C$_2$, has been directionally solidified using fluidized-bed cooling, and the structures obtained have been compared with those obtained using liquid metal cooling. The requirement here is to maintain a planar rather than a dendritic solidification front in order to have well aligned composite microstructure. It is well known that the condition for plane front solidification is that the ratio G/R should exceed a critical value (G/R)$_c$. Thus the use of higher temperature gradients allows well aligned composite microstructures to be maintained at higher rates of solidification.

Comparing the microstructures of γ-γ'-Cr$_3$C$_2$ directionally solidified at 300 and 600 mmh$^{-1}$ using fluidized bed, liquid metal and conventional Bridgman cooling, the fluidized bed material had a well aligned microstructure which was similar in appearance to that obtained using liquid metal cooling but considerably finer than that obtained by conventional Bridgman cooling. The maximum solidification rate giving good eutectic alignment in the present solidification configuration was 600 mmh$^{-1}$ for both the fluidized bed and liquid metal cooled material, and 300 mmh$^{-1}$ for the conventional Bridgman cooled alloy.

FIG. 2 shows a modification of the apparatus of FIG. 1 in which the mould heater area is isolated from the fluidized bed by a sealing member 21 and a separate gas exit 22 from the cylinder 5 is provided and connected to rotary vacuum pumps (not shown) of high pumping capacity as indicated by the arrow G by way of coolers, filters and valves. A control valve 23 is also provided on the gas inlet, indicated by the arrow F.

These features are considered important particularly where helium gas is used to give the highest cooling efficiencies, in order to give re-circulation of expensive cooling gases and thus render the technique more attractive to potential industrial users.

Incidental advantages arise in that there is no longer a need for the alloy under directional solidification to be exposed to a gaseous atmosphere, with consequent reduction of risk of contamination and the loss of heat from the mould heater is reduced with the elimination of gas flow through this region.

In order to run such a fluidized bed under sub-atmospheric conditions the gas inlet pressure would have to be maintained at about 13 kPa. The gas outlet pressure would then be about 133 Pa so that the typical pressure drop through the bed would remain between 7 and 35 kPa, the actual value depending on depth and on density of the powder. A pressure of 133 Pa should be acceptable to the mould heater and mould regions during directional solidification. Control of the gas pressures would of course be interlinked to ensure that the correct pressure differentials always exist. No seal would then be essential between the vacuum chamber and the fluidized bed, but in order to achieve a higher degree of vacuum during the prior melting stage, the fluidized bed would be shut off.

Some of the features described in relation to FIGS. 1 and 2 have been selected by way of their general suitability but they are in no way exclusive. Thus, any suitable heating source (e.g. resistance heated furance) may be used while it would be possible also to melt the whole of the contents of the mould rather than a portion thereof.

Moreover, by replacing the cylinder cooling coil by an additional heating source, a well controlled low temperature gradient can be maintained that may prevent fracture by thermal shock during the growth of single crystals of brittle materials.

We claim:

1. A method of controlling the formation of a crystalline structure comprising the steps of:
    (a) progressively melting a crystalline material by effecting relative axial movement of the crystalline material with respect to a heat source; and
    (b) subsequently extracting heat from the molten material to directionally solidify the molten material in step with the melting of step (a) to form an aligned crystalline microstructure wherein the extraction of heat from the molten material is accomplished by means of a fluidized bed of a fine chemically inert powder fluidized by an inert gas.

2. A method of controlling the formation of a crystalline structure according to claim 1 in which the molten material is removed progressively from the heat source into the fluidized bed.

3. A method of producing an aligned crystalline microstructure, said method comprising the steps of:
    (a) progressively melting a crystalline material by effecting relative axial movement between the crystalline material and a heat source; and
    (b) controlling the directional solidification of the molten material produced according to step (a) by extracting heat therefrom by moving the molten material through a fluidized bed of a fine chemically inert powder fluidized by an inert gas to suppress nucleation of the molten material ahead of the advancing interface between the molten material and the directional solidified material to produce an aligned crystalline microstructure.

4. A method of controlling the formation of a crystalline structure according to claim 1, claim 2 or claim 3 in which the powder is a stable ceramic.

5. A method of controlling the formation of a crystalline structure according to claim 1, claim 2 or claim 3 in which the particle size of the powder is of the order of 100 μm.

6. A method of controlling the formation of a crystalline structure according to claim 1, claim 2 or claim 3 in which the crystalline material is a metal alloy.

7. A method of controlling the formation of a crystalline structure according to claim 1, claim 2 or claim 3 wherein the crystalline material is a nickel-base alloy.

8. A method of controlling the formation of a crystalline structure according to claim 1, claim 2 or claim 3 in which the gas is drawn from the fluidized bed at subatmospheric pressure.

9. A method of controlling the formation of a crystalline structure according to claim 8 in which the gas outlet pressure is substantially 133 Pa.

10. A method of casting a metal article having aligned crystalline microstructures, said method comprising the steps of introducing a nickel-base alloy into a mould, progressively melting the alloy by effecting relative movement between the mould and a heat source, and directionally solidifying the molten alloy by transferring heat therefrom to a fluidized bed to produce aligned crystalline microstructures.

11. A method of casting a metal article according to claim 10 in which the mould is removed progressively from the heat source into the fluidized bed.

12. A method of casting a metal article according to claim 10 or claim 11 in which solidification of the molten alloy is initiated by a water-cooled chill.

13. A method of casting a metal article according to claim 10 or claim 11 in which the fluidized bed comprises a fine chemically inert powder fluidized by an inert gas.

14. A method of casting a metal article according to claim 13 in which the powder is a stable ceramic.

15. A method of casting a metal article according to claim 13 in which the powder is alumina.

16. A method of casting a metal article according to claim 13 in which the gas is helium.

17. A method of casting a metal article according to claim 13 in which the gas is drawn from the fluidized bed at subatmospheric pressure.

18. A method of casting a metal article according to claim 17 in which the gas outlet pressure is substantially 133 Pa.

19. Apparatus for metal casting comprising:
    an open-ended mould,
    a hollow metal platform through which water can be circulated for carrying said mould,
    a heating chamber to heat the mould,
    a fluidizable bed for cooling the mould, and
    means for first moving the platform, and thus said mould, axially through said heating chamber and then on through said fluidizable bed to thereby progressively heat a portion of said mould in said heating chamber prior to cooling of the mould portion in said fluidizable bed.

20. Apparatus for metal casting according to claim 19 in which the fluidizable bed comprises a fine chemically inert powder material and gas-introducing means for introducing an inert fluidizing gas into said powder material.

21. Apparatus for metal casting according to claim 20 in which the powder material is a ceramic.

22. Apparatus for metal casting according to claim 21 in which the powder material is alumina.

23. Apparatus for metal casting according to claim 19, claim 20 or claim 21 wherein said gas introducing means is adapted to introduce helium.

24. Apparatus for metal casting according to claim 19, claim 20 or claim 21 further comprising vacuum means for withdrawing the gas from the fluidizable bed at a sub-atmospheric pressure.

25. Apparatus for metal casting according to claim 23 wherein said vacuum means is adapted to withdraw gas from said fluidizable bed at a pressure of substantially 133 Pa.

26. An apparatus for metal casting comprising:
an open ended mould for accepting an quantity of crystalline material therein;
means defining a heating zone including heat source means for melting the crystalline material in said mould to form a molten material;
means defining a cooling zone downstream of said heating zone, said cooling zone including a bed of fine chemically inert powder and fluidizing means in fluid communication with said bed for introducing an inert gas therein to fluidize said bed; and
means connected to said mould for first moving said mould through said heating zone to progressively melt said crystalline material therein and then for moving said mould through said cooling zone to effect heat transfer between the molten material and the fluidized bed to progressively directionally solidify the molten material and for controlling the recrystallization of the molten material to produce an aligned crystalline microstructure by suppressing the nucleation of the molten material ahead of the interface between the molten material and the directionally solidified material as said interface advances in relative position in said mould by virtue of said mould being progressively moved first through said heating zone and then through said cooling zone.

27. A method of producing a metallic component having aligned crystalline grain structure comprising the steps of:
(a) providing a mould containing molten metal to be solidified;
(b) effecting relative axial movement of the mould containing the molten metal to be solidified from a heating zone to a cooling zone; wherein said cooling zone consists of a fluidized bed of a fine chemically inert powder fluidized by an inert gas.

28. Apparatus for metal casting comprising:
a mould for containing a quantity of metal;
a heating chamber establishing a heating zone for heating the mould;
a cooling chamber, downstream of said heating chamber, establishing a cooling zone for cooling said mould downstream of said heating zone, said cooling chamber including a bed of a fluidizable material and means in fluid communication with said bed for fluidizing said fluidizable material; and
drive means connected to said mould for effecting progressive axial movement of said mould between said heating and cooling zones to thereby progressively heat and cool said mould, respectively.

29. Apparatus as in claim 28 wherein said cooling chamber includes walls and cooling means for circulating a cooling fluid to cool said walls.

30. Apparatus as in claim 28 further comprising platform means connected to said drive means for carrying said mould.

31. Apparatus as in claim 30 wherein said platform means includes means for providing a path through which a cooling fluid can pass.

32. Apparatus as in claim 31 wherein said platform means is hollow.

* * * * *